(12) United States Patent
Croft

(10) Patent No.: US 8,867,186 B2
(45) Date of Patent: Oct. 21, 2014

(54) LOW POWER ANALOG SWITCH CIRCUITS THAT PROVIDE OVER-VOLTAGE, UNDER-VOLTAGE AND POWER-OFF PROTECTION, AND RELATED METHODS AND SYSTEMS

(71) Applicant: Intersil Americas LLC, Milpitas, CA (US)

(72) Inventor: Gregg D. Croft, Palm Bay, FL (US)

(73) Assignee: Intersil Americas LLC, Milpitas, CA (US)

( * ) Notice: Subject to any disclaimer, the term of this patent is extended or adjusted under 35 U.S.C. 154(b) by 176 days.

(21) Appl. No.: 13/629,254

(22) Filed: Sep. 27, 2012

(65) Prior Publication Data

US 2014/0085761 A1    Mar. 27, 2014

(51) Int. Cl.
*H02H 3/00*    (2006.01)

(52) U.S. Cl.
USPC ............................................................. 361/90

(58) Field of Classification Search
USPC ............................................................. 361/90
See application file for complete search history.

(56) References Cited

U.S. PATENT DOCUMENTS

| | | | | |
|---|---|---|---|---|
| 5,008,631 | A * | 4/1991 | Scherer et al. | 330/51 |
| 6,188,088 | B1 * | 2/2001 | Ramakrishnan | 257/173 |
| 6,924,963 | B2 * | 8/2005 | Young et al. | 361/111 |
| 7,504,749 | B2 * | 3/2009 | Von Seidel | 307/131 |
| 7,728,649 | B1 * | 6/2010 | Webb et al. | 327/534 |

OTHER PUBLICATIONS

Analog Devices Inc., "Power-Off Protection ±5 V, +12 V, Quad SPST Switches with 5 Ω On Resistance", ADG4612/ADG4613 Data Sheet, Oct. 2010, pp. 1-24.
Intersil, "High-Speed USB 2.0 (480Mbps) Multiplexer with Overvoltage Protection (OVP) and Overvoltage Indicator Output", ISL54224 Data Sheet, FN6969.0, Jun. 7, 2010, pp. 1-18.
Maxim Integrated, "72V, Overvoltage-Protection Switches/Limiter Controllers with an External MOSFET", MAX6495-MAX6499 Datasheet, 19-3778, Rev. 9; Feb. 2012.
Texas Instruments, "Overvoltage Protection Controller", TPS2400 Datasheet, SLUS599A, Jun. 2004 (Revised Aug. 2008.

* cited by examiner

*Primary Examiner* — Stephen W Jackson
(74) *Attorney, Agent, or Firm* — Vierra Magen Marcus LLP

(57) ABSTRACT

Analog switch circuits, methods for use with analog switch circuits, and devices and systems including analog switch circuits are disclosed herein. Such analog switch circuits include an analog switch input terminal (In), an analog switch output terminal (Out), and an analog switch control terminal (Ctl). During a normal-voltage condition, the input terminal (In) of the analog switch circuit is selectively connected and disconnected to/from the output terminal (Out) in dependence on a control signal received at the control terminal (Ctl). During an over-voltage condition, the input terminal (In) is disconnected from the output terminal (Out) regardless of the control signal received at the control terminal (Ctl). Additionally, during an under-voltage condition, the input terminal (In) is disconnected from the output terminal (Out) regardless of the control signal received at the analog switch control terminal (Ctl). In specific embodiments, symmetric protection and/or power-off protection is/are also provided.

22 Claims, 9 Drawing Sheets

LOW POWER ANALOG SWITCH CIRCUITS THAT PROVIDE OVER-VOLTAGE, UNDER-VOLTAGE AND POWER-OFF PROTECTION, AND RELATED METHODS AND SYSTEMS

BACKGROUND

Analog switch circuits with over-voltage protection are used in various applications, including automotive and industrial applications. Some such analog switch circuits monitor an input voltage and control an external N-channel metal-oxide-semiconductor field-effect transistor (NMOSFET) switching transistor device, which can also be referred to as an NMOS switching transistor device, to isolate a load at the output during an over-voltage condition at the input. For example, some analog switch circuits with over-voltage protection create an onboard reference voltage and then compare that reference voltage to an input voltage to determine whether or not to open the switch. While this works well for a limited range of voltages, it is not believed that such analog switch circuits can protect downstream devices from input voltages significantly higher than the positive power supply voltage rail (Vdd) or lower than the negative power supply voltage rail (Vss).

Most prior analog switch circuits with over-voltage protection use a band-gap reference circuit to produce the aforementioned onboard reference voltage, and a comparator to compare an input voltage signal to that reference voltage. However, the band-gap reference voltage generator and the comparator in those analog switch circuits draw a lot of current, so these over-voltage protected analog switch circuits are not efficient from a power standpoint. More specifically, the above described analog switch circuits typically require a quiescent supply current (Idd) on the order of 10s of microAmps.

Further, the aforementioned analog switch circuits are not believed to provide upstream protection if the over-voltage condition occurs at the output, as opposed to the input. Additionally, the aforementioned analog switch circuits are not believed to provide over-voltage protection when the device within which the switch is located is powered-off. For example, such analog switch circuits may not protect components from a high voltage electrostatic discharge (ESD) event that occurs when the device within which the switch is located is powered-off.

DETAILED DESCRIPTION

Figure 1:
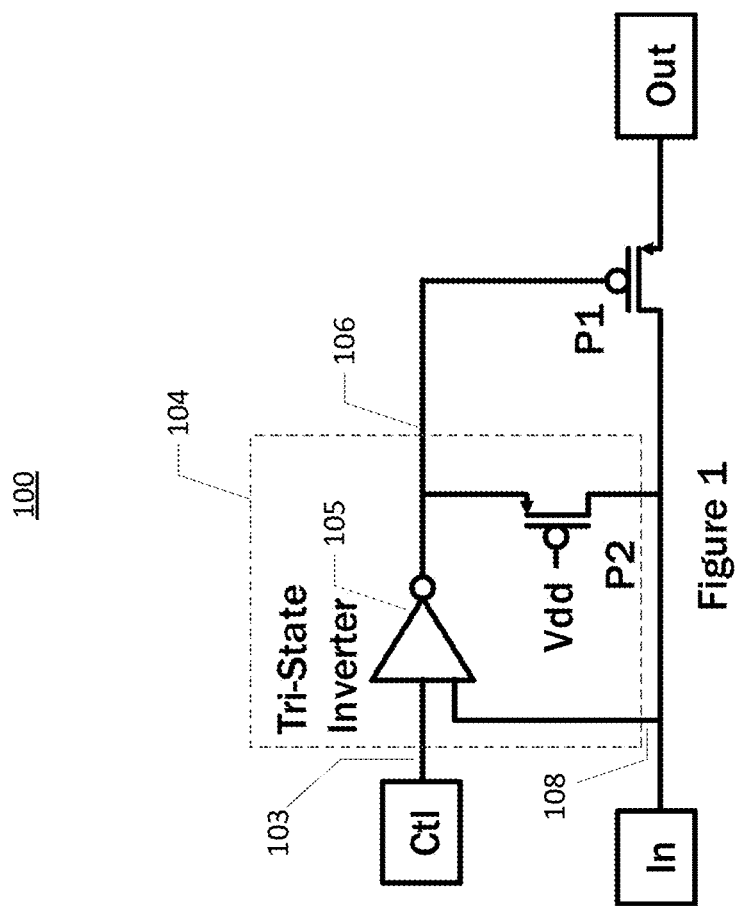
FIG. 1 illustrates an analog switch circuit according to an embodiment of the present invention.

In the following detailed description, reference is made to the accompanying drawings that form a part hereof, and in which is shown by way of illustration specific illustrative embodiments. It is to be understood that other embodiments may be utilized and that mechanical and electrical changes may be made. The following detailed description is, therefore, not to be taken in a limiting sense. In the description that follows, like numerals or reference designators will be used to refer to like parts or elements throughout. In addition, the first digit of a reference number typically identifies the drawing in which the reference number is first introduced.

Certain embodiments of the present invention are directed to analog switch circuits that are designed to protect downstream devices from over voltage-events and under-voltage events, which can also be referred to as over-voltage conditions and under-voltage conditions. The analog switch circuits described herein can alternatively be referred to as integrated switches or over-voltage and under-voltage protection switches. As will be described in additional detail below, over-voltage and under-voltage protection is accomplished by comparing an incoming voltage signal to both high and low reference voltages and opening the switch if an incoming voltage signal falls outside the range established by the two reference voltages, all the while drawing a very low and preferably minimal quiescent supply current (Idd), which is less than 1 nanoAmp. By contrast, most analog switch circuits that provide over-voltage protection have quiescent supply currents of 10s of microAmps. Accordingly, embodiments of the present invention draw about 4 to 5 orders of magnitude less current than most other over-voltage protected analog switch circuits, which makes the analog switch circuits of embodiments of the present invention very attractive for mobile applications.

Referring first to FIG. 1, an analog switch circuit 100 is shown as including an analog switch input terminal (In), an analog switch output terminal (Out), an analog switch control terminal (Ctl), a switching element transistor P1, and a switch controller 104. The switching element transistor P1 is a p-channel metal-oxide-semiconductor field-effect transistor (PMOSFET), which can also be referred to as a PMOS transistor, a switching element, or simply a transistor. The switch controller 104 is shown as including a PMOS transistor P2 and a tri-state inverter 105. The PMOS transistor P1, which functions as a switching element, includes a drain connected to the analog switch input terminal (In), a source connected to the analog switch output terminal (Out), and a gate connected to a controller output 106 of the switch controller 104 (which, in this embodiment, is an output of the tri-state inverter 105). The input of the switch controller 104 (which, in this embodiment, is an input of the tri-state inverter 105) is connected to the analog switch control terminal (Ctl). The switch controller 104 also includes an override input terminal 108 (which, in this embodiment, is a tri-state control terminal of the tri-state inverter 105) that is connected to the analog switch input terminal (In). The controller output 106 of the switch controller 104 (which, in this embodiment, is the output of the tri-state inverter 105), is connected to the gate of the PMOS transistor P1, and to the source of the PMOS transistor P2. A drain of the PMOS transistor P2 is connected to the analog switch input terminal (In), and a gate of the PMOS transistor P2 is connected to a high voltage rail (Vdd), which is sometimes referred to as a positive power supply voltage rail.

The override terminal 108 is used to control whether the switch controller output 106 (output by the switch controller 104) is either dependent upon the switch control signal received at the analog switch control terminal (Ctl), or is floating regardless of the switch control signal received at the analog switch control terminal (Ctl). In those embodiments where the switch controller 104 is implemented using a tri-state logic circuit (e.g., a tri-state inverter 105), then the override terminal 108 is the tri-state control terminal of the tri-state logic circuit, and the switch controller output 106 is the output of the tri-state logic circuit (e.g., the output of the tri-state inverter 105). More specifically, in those embodiments where the switch controller 104 is implemented using a tri-state inverter 105, the override terminal 108 is used to control whether the switch controller output 106 is either dependent upon the switch control signal received at the analog switch control terminal (Ctl), or is in a tri-state mode. As explained herein, the tri-state mode can be one of two different pseudo tri-state modes. The specific pseudo tri-state mode is dependent upon whether the input voltage signal (received at the analog switch input terminal (In)), is either above the high voltage rail (Vdd), or is below the low voltage rail (Vss).

When the PMOS transistor P1 is turned on, the analog switch input terminal (In) is connected to the analog switch output terminal (Out), in which case the analog switch circuit is considered closed. When the analog switch circuit is closed, the voltage signal at the analog switch input terminal (In) is passed to the analog switch output terminal (Out). When the PMOS transistor P1 is turned off, the analog switch input terminal (In) is disconnected from the analog switch output terminal (Out), in which case the analog switch circuit is considered open. When the analog switch circuit is open, the voltage signal at the analog switch input terminal (In) is not passed to the analog switch output terminal (Out). The PMOS transistor P1 is normally controlled by the controller output 106 of the switch controller 104 (which, in this embodiment, is the output of the tri-state inverter 105). The input of the switch controller 104 (which, in this embodiment, is the input of the tri-state inverter 105) receives a switch control signal from the analog switch control terminal (Ctl). The switch control signal is a binary signal that can either be logic high or logic low (which can also be referred to simply as high and low). If the switch control signal is high, then the output of the tri-state inverter 105 will normally be low, which causes the PMOS transistor P1 to be turned on. If the switch control signal is low, then the output of the tri-state inverter 105 will normally be high, which turns the PMOS transistor P1 off. This configuration acts like a normal analog switch as long as the input voltage signal (received at the analog switch input terminal (In)) is less than the high voltage rail (Vdd). However, if the input voltage (received at the analog switch input terminal (In)) exceeds the high voltage rail (Vdd) by a threshold voltage (Vth), then the PMOS transistor P2 will turn on and attempt to pull the gate of the transistor P1 up to the high input voltage. At the same time, the tri-state inverter 105 is put into tri-state mode when an input voltage signal higher than the high voltage rail (Vdd) by the threshold voltage is applied to the tri-state control terminal 108, as described in additional detail below. This causes the tri-state inverter 105 to relinquish control of the transistor P1 to the transistor P2, and the transistor P2 turns on and pulls the gate of the transistor P1 high, turning the transistor P1 off. This happens regardless of the logic state of the switch control signal received at the analog switch control terminal (Ctl). Turning off the switch prevents the high voltage on the analog switch input terminal (In) from reaching the analog switch output terminal (Out) and possibly causing damage to one or more downstream device(s). Once the input voltage signal (received at the analog switch input terminal (In)) drops far enough below the high voltage rail (Vdd), then the analog switch circuit goes back into normal operating mode.

Each of the transistors includes a source to body diode and the drain to body diode. For example, in the PMOS transistor P1, the drain and the source are both P-type material and the body is N-type material, so a diode exists between the source (P) and the body (N), and another diode exists between the drain (P) and the body (N). The complement is true for an NMOS transistor, such as for the transistor N1, which is discussed below with reference to FIG. 4. The bodies of most PMOS transistors are typically tied to the high voltage rail (Vdd). However, if the bodies of the PMOS transistors P1 and P2 in FIG. 1 were tied to the high voltage rail (Vdd), then these body diodes would forward bias and conduct considerable amounts of current if the input voltage signal (received at the analog switch input terminal (In)) were pulled more than a diode drop (e.g., Vgs) above the high voltage rail (Vdd). This would cause a high current that could damage metal lines and junctions on a die (which includes the analog switch circuit) and/or blow out bond wires. In accordance with an embodiment, to avoid this problem, a special body node is added, which the various PMOS bodies can be connected to, as will be described below with reference to FIG. 2.

Figure 2:
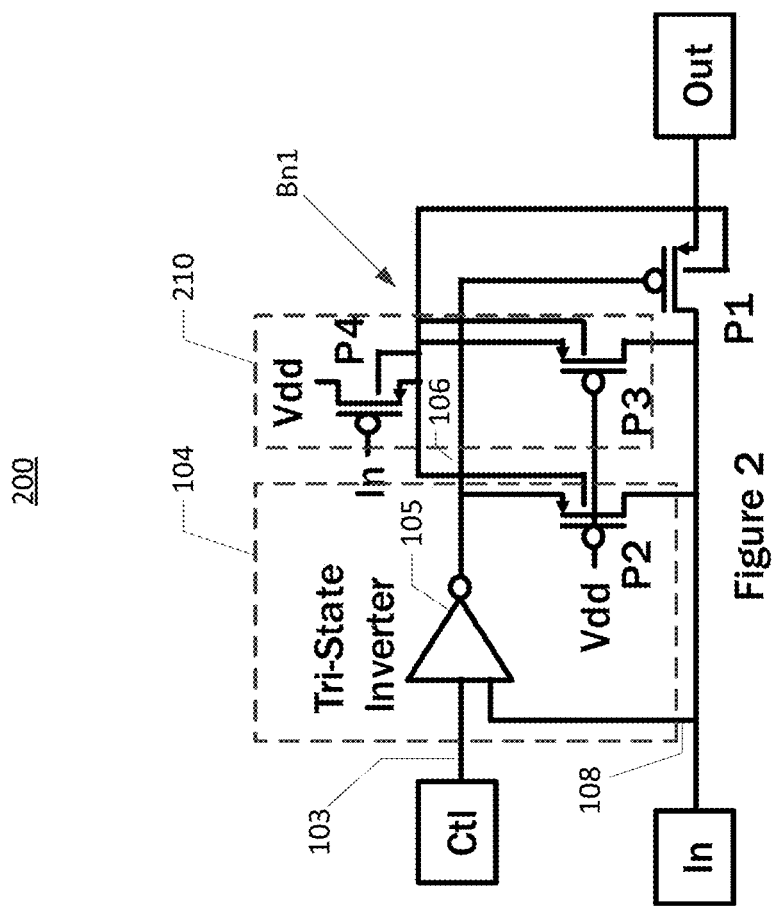
FIG. 2 illustrates an analog switch circuit according to an embodiment of the present invention that builds up the embodiment described with reference to FIG. 1.

Referring now to FIG. 2, the analog switch circuit shown 200 therein is similar to the analog switch circuit 100 described with reference to FIG. 1, but with additional PMOS transistors P3 and P4 that are used to provide a first body node Bn1. Accordingly, the PMOS transistors P3 and P4 are considered elements of a body controller 210. More specifically, in FIG. 2 the connected together sources of the PMOS transistors P3 and P4 provide the first body node Bn1. A drain of the PMOS transistor P3 is connected to the analog switch input terminal (In), and a gate of the PMOS transistor P3 is connected to the gate of the PMOS transistor P2, which as explained above is connected to the high voltage rail (Vdd). A drain of the PMOS transistor P4 is connected to the high voltage rail (Vdd), and a gate of the PMOS transistor P4 is connected to the analog switch input terminal (In). The body of each of the PMOS transistors P1, P2, P3 and P4 is connected to the body node Bn1. When the input voltage (received at the analog switch input terminal (In)) is in within a normal operation range (e.g., below the high voltage rail (Vdd)), then the PMOS transistor P4 is normally on, in which case the body node Bn1 is connected to the high voltage rail (Vdd) through the turned on PMOS transistor P4. However, if the input voltage signal (received at the analog switch input terminal (In)) exceeds the high voltage rail (Vdd) by a threshold voltage, then the PMOS transistor P4 turns off and the PMOS transistor P3 turns on, which pulls the body node Bn1 up to the voltage of the input voltage signal and avoids forward biasing of any of the body diodes.

Figure 3:
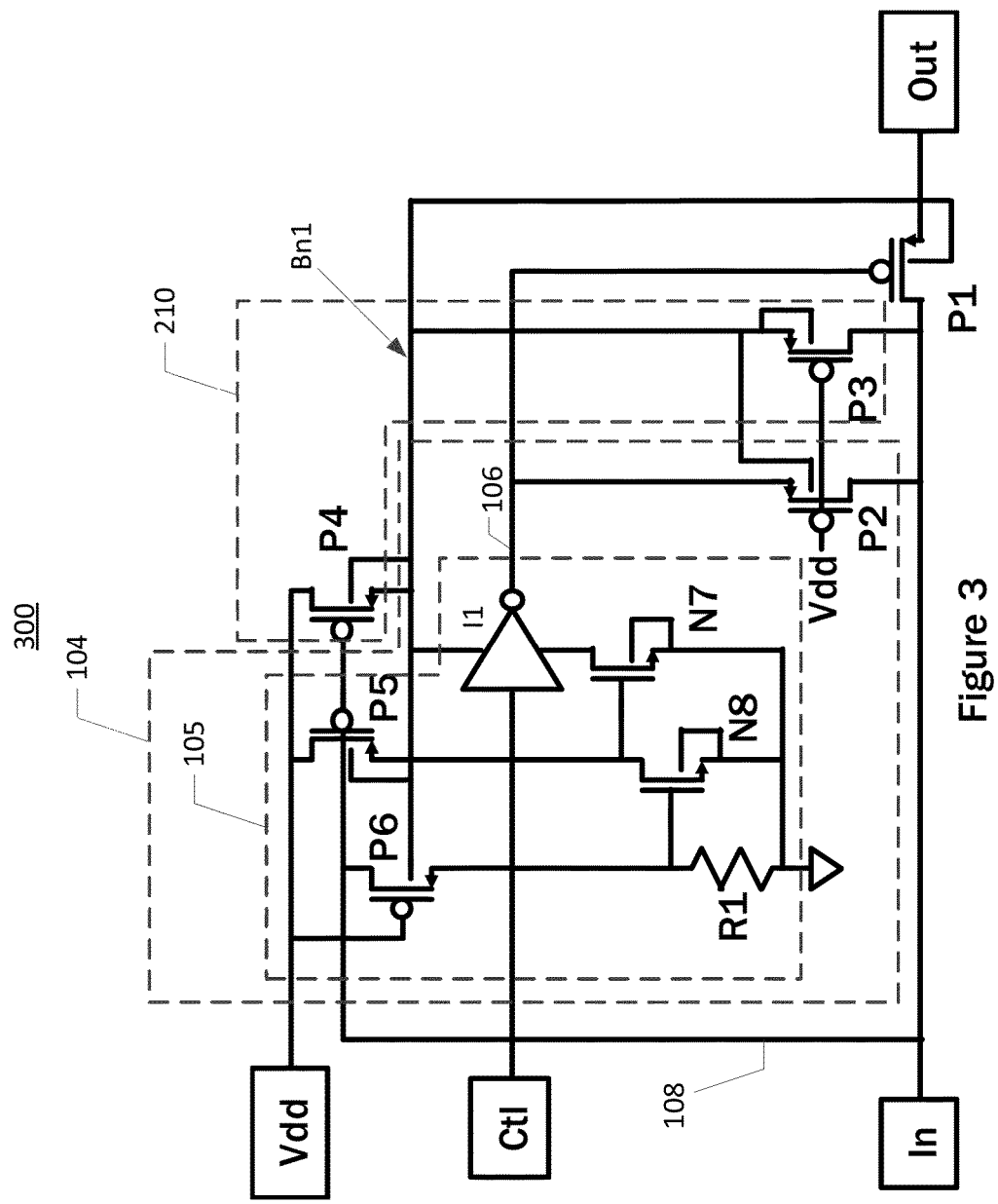
FIG. 3, which illustrates an analog switch circuit, provides additional details of the tri-state inverter introduced in FIGS. 1 and 2, in accordance with an embodiment of the present invention.

FIG. 3, which shows an analog switch circuit 300, will now be used to describe how to construct the tri-state inverter 105, according to an embodiment of the present invention, and have it tri-state when the input voltage signal exceeds the high voltage rail (Vdd). Referring to FIG. 3, the tri-state inverter 105 is shown as including an inverter I1, PMOS transistors P5 and P6, NMOS transistors N7 and N8, and a resistor R1. When the input voltage (received at the analog switch input terminal (In)) is in within a normal operation range (e.g., below the high voltage rail (Vdd)), then the transistors P4, P5 and N7 are normally on and the transistors P2, P3, P6, and N8 are normally off. However, if the input voltage signal (received at the analog switch input terminal (In)) exceeds the high voltage rail (Vdd) by at least a threshold voltage, then these transistors all change state (i.e., the transistors P4, P5 and N7 are turned off, and the transistors P2, P3, P6 and N8 are turned on). The normally on PMOS transistor P4 provides a positive supply voltage to the inverter I1 by connecting a positive supply terminal of the inverter I1 to the high voltage rail (Vdd). If input voltage signal (received at the analog switch input terminal (In)) exceeds the high voltage rail (Vdd) by a threshold voltage, then the PMOS transistor P4 turns off and the PMOS transistor P3 turns on. Under this condition, which can be referred to as an over-voltage condition, the PMOS transistor P3 provides the positive supply voltage for the inverter I1, and that voltage comes directly from the input voltage signal received at the analog switch input terminal (In). Here the threshold voltage is a gate-to-source voltage (Vgs). A typical value for Vgs is 0.6 Volts, but other values are possible and within the scope of the present invention.

The normally on NMOS transistor N7 provides the negative supply connection for the inverter I1. However, during an over-voltage condition the NMOS transistor N7 gets turned off, which prevents the inverter I1 from driving its output low. This is accomplished by a combination of the transistors P5, P6 and N8. During an over-voltage condition the PMOS transistor P5 is turned off, which disconnects the gate of the NMOS transistor N7 from the high voltage rail (Vdd). In addition, the PMOS transistor P6 is turned on, which pulls the gate of the NMOS transistor N8 up to the high voltage rail (Vdd), thereby turning on the NMOS transistor N8. The NMOS transistor N8 then pulls down the gate of the NMOS transistor N7, thereby turning the NMOS transistor N7 off. This puts the inverter I1 in a pseudo tri-state mode, meaning the inverter I1 can't pull its output low. In other words, when the inverter I1 is in this pseudo tri-state mode, the output of the inverter is floating if the input to the inverter is high. With the inverter I1 in the pseudo tri-state mode, the PMOS transistor P2 has no problem pulling the gate of the PMOS transistor P1 up to the high input voltage, thereby turning the PMOS transistor P1 off. These transistors are all configured to draw low and preferably minimal current during the normal operating mode. However, during an over-voltage condition, some current will flow through the PMOS transistor P6 based on the over-voltage and the value of the resistor R1. However, this current is provided by the over-voltage signal received via the analog switch input terminal (In), not the connection to the high voltage rail (Vdd). Therefore, quiescent supply current (Idd) is always very low, on the order of leakage currents, no matter what condition the analog switch circuit is placed in.

Most analog switch circuits are constructed using parallel NMOS and PMOS transistors, similar to a transmission gate. This is done to allow the analog switch circuit to work effectively over the full input voltage range and to help flatten out the on resistor (RON) vs. input voltage (Vin) characteristic. In a normal transmission gate style analog switch circuit, the PMOS transistor will pass voltages greater than the high voltage rail (Vdd) and the NMOS transistor will pass voltages less than the low voltage rail (Vss) (which is sometimes referred to as a negative power supply voltage rail). Both over-voltage and under-voltage events could potentially damage sensitive circuitry downstream from the switch. The circuitry shown in FIG. 3 only addresses the PMOS over-voltage issue. The circuitry shown in FIG. 4, discussed below, addresses both over-voltage and under-voltage conditions.

Figure 4:
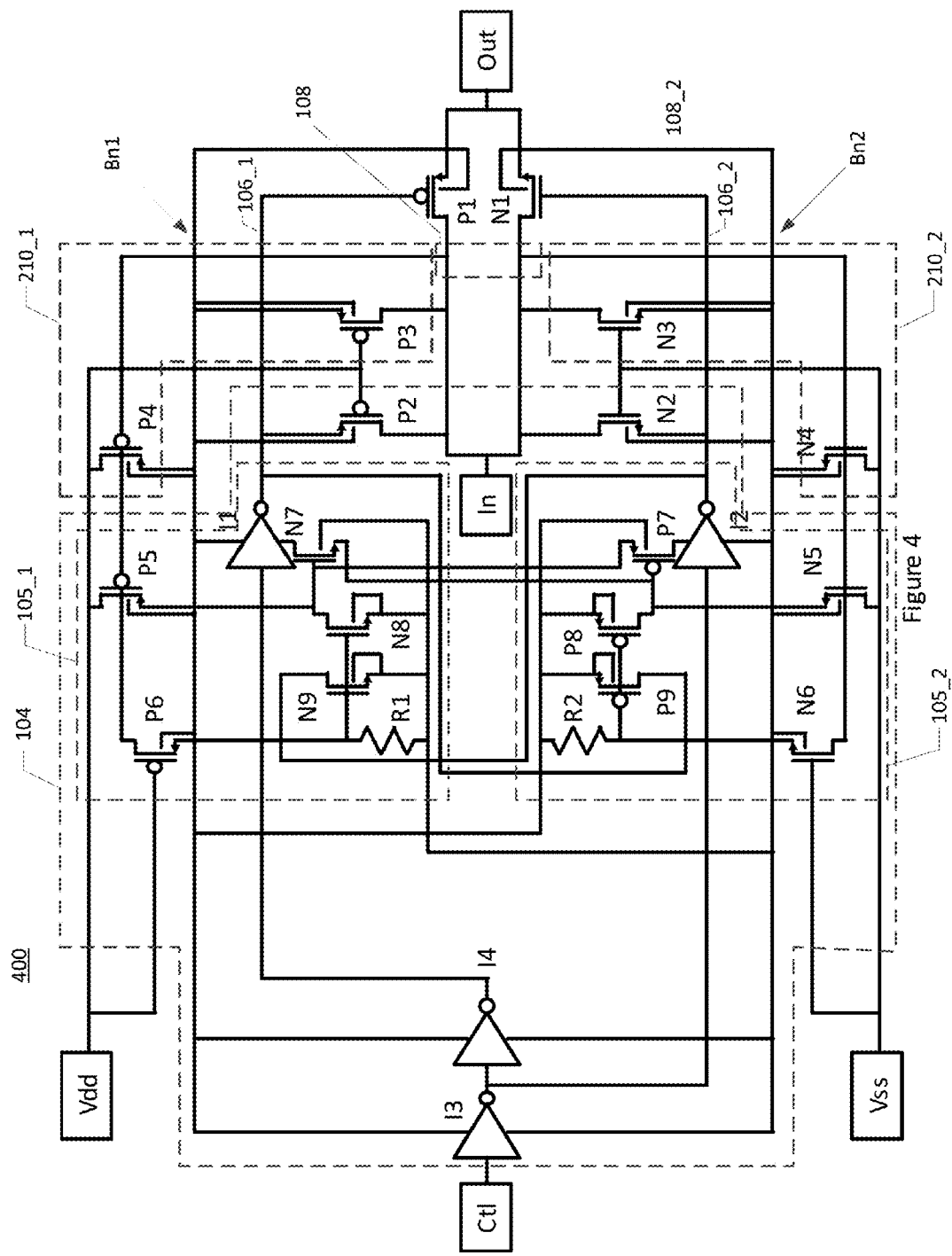
FIG. 4 illustrates an analog switch circuit according to an embodiment of the present invention that builds up the embodiment described with reference to FIG. 3 by adding circuitry that also provides under-voltage protection.

In FIG. 4 the PMOS switching transistor element is labeled P1 and the NMOS switching element transistor is labeled N1. These two transistors are connected in parallel in the traditional transmission gate style, i.e., their sources are connected to one another, and their drains are connected to one another. In FIG. 4 the upper tri-state inverter is labeled 105_1, and a lower tri-state inverter is added and labeled 105_2. The tri-state inverter 105_2 includes an inverter I2, PMOS transistors P7, P8 and P9, NMOS transistors N5 and N6, and a resistor R2, which circuitry is connected as a mirror image of the circuitry of the tri-state inverter 105_1, as can be appreciated from FIG. 4. Both tri-state inverters 105_1 and 105_2 are part of the switch controller 104. In FIG. 4 the switch controller 104 is also shown as including an NMOS transistor N2, which is used to help control the NMOS switching element transistor N1 in a similar manner that the PMOS transistor P2 is used to help control the PMOS switching element transistor P1. The switch controller 104 also includes inverters I3 and I4, which are used to provide the appropriate logic levels (high or low) to the inputs of the inverters I1 and I2, in dependence on the switch control signal received at the switch control terminal (Ctl). In FIG. 4 the switch controller 104 is shown as including a first controller output 106_1 that is used to control the upper portion of the circuit, and a second controller output 106_2 that is used to controller the lower portion of the circuit. During an over-voltage condition the controller output 106_1 is floating and the controller output 106_2 is only allowed to pull low, not high. During an under-voltage condition the controller output 106_2 is floating and the controller output 106_1 is only allowed to pull high, not low. This functionality is achieved using the pseudo-tri state modes described herein.

In FIG. 4, the upper body control circuit is labeled 210_1, and a lower body control circuit is labeled 210_2, which includes NMOS transistors N3 and N4. The connected together sources of the NMOS transistors N3 and N4 provide a second body node Bn2. The body of each of the NMOS transistors N1, N2, N3 and N4 is connected to the second body node Bn2. When the input voltage (received at the analog switch input terminal (In)) is in within a normal operational range, then the NMOS transistor N4 is normally on, in which case the second body node Bn2 is connected to the low voltage rail (Vss) through the turned on NMOS transistor N4. However, if the input voltage signal (received at the analog switch input terminal (In)) falls below the low voltage rail (Vss) by a threshold voltage, then the NMOS transistor N4 turns off and the NMOS transistor N3 turns on, which pulls the second body node Bn2 down to the voltage of the input voltage signal and avoids forward biasing of any of the body diodes.

Additional details of how the analog switch circuit shown in FIG. 4 operates in response to over-voltage and under-voltage conditions will now be described. When an over-voltage condition is applied to the analog switch input terminal (In), the top half of this circuit acts the same way it does in FIG. 3 to prevent the PMOS transistor P1 from conducting. The NMOS transistor N9 is added to the top half of the circuit in FIG. 4. An over-voltage condition turns on the PMOS transistor P6, which provides a sufficient gate-to-source voltage (Vgs) to turn on the NMOS transistors N9 and N8. The drain of NMOS transistor N9 is cross-coupled to the gate of the NMOS switching element transistor N1. When the NMOS transistor N9 is turned on, the gate of NMOS switching element N1 is pulled down thereby turning it off too as long as the inverter I2, in the bottom half of the circuit, isn't pulling high at the same time. This condition is prevented by routing the positive power supply connection for the inverter I2 through the PMOS transistor P5. When the over-voltage condition occurs on the analog switch input terminal (In), the PMOS transistor P5 is turned off, which puts the inverter I2 in its pseudo tri-state mode, which means it can't pull its output high. In other words, when the inverter I2 is in this pseudo tri-state mode, the output of the inverter I2 is floating if the input to the inverter is low. This leaves the NMOS transistor N9 free to pull down the gate of the NMOS switching transistor N1, which shuts off the NMOS transistor N1.

The mirror image of these events occurs when an input voltage applied to the analog switch input terminal (In) falls below the low voltage rail (Vss) by a threshold voltage, which is referred to as an under-voltage condition. Here the threshold voltage is a gate-to-drain voltage (Vgd). A typical value for Vgd is 0.6 Volts, but other values are possible and within the scope of the present invention. In certain embodiments, where all the transistors of the analog switch circuit are symmetric, the gate and the drain are indistinguishable, and Vgs and Vgd are the same.

When an under-voltage condition occurs, the NMOS transistors N4 and N5 are turned off and the NMOS transistors N2, N3, and N6 are turned on. The NMOS transistor N6 turning on will turn on the PMOS transistors P9 and P8, which subsequently will turn off the PMOS transistor P7. The combination of the transistors P7 and N4 both being off places the inverter I2 in pseudo tri-state, thereby leaving the NMOS transistor N2 free to pull down the gate of the NMOS switching transistor N1 to the incoming under-voltage, thus turning the transistor N1 off. At the same time, the PMOS transistor P9 pulls up on the gate of the transistor P1 attempting to turn it off. The inverter I1 is prevented from fighting this action because its negative supply has been routed through the transistor N5, which is turned off.

As can be appreciated from FIG. 4, the inverters I3 and I4 get their positive power through the PMOS transistor P4 and their negative power through the NMOS transistor N4. Normally the transistors P4 and N4 are both on, so the inverters I2 and I3 normally receive power from the high and low voltage rails (Vdd and Vss). However, during an over-voltage condition the transistor P4 is turned off and the transistor P3 is turned on. Under this condition, the inverters I3 and I4 receive their positive supply voltage from the incoming over-voltage signal. Likewise during an under-voltage condition, the inverters I3 and I4 receive their negative supply from the under voltage signal. To prevent these inverters from drawing shoot-thru current during these fault conditions, a level shifter circuit (not shown) could be used on the input of the analog switch control terminal (Ctl). This level shifter circuit would shift the standard Vdd and Vss logic levels up or down to the supply voltages used on these inverters. Level shifter circuits such as this are commonly known throughout the industry and need not be described herein.

The NMOS transistor N1 is turned off during an over-voltage condition by the NMOS transistor N9. More specifically, the gate of the NMOS transistor N1 is pulled down to the low voltage rail (Vss) through the turned-on NMOS transistor N4. This can only be done if the inverter I2 is prevented from fighting the low signal being applied to the gate of the NMOS transistor N1. Here, the inverter I2 is disabled from pulling high because its positive power supply is routed through the PMOS transistor P5, which is turned off during in over-voltage event.

The PMOS transistor P1 is similarly turned off during an under-voltage condition because the PMOS transistor P9 is turned on and pulls the gate of the PMOS transistor P1 up to the high voltage rail (Vdd) through the turned on PMOS transistor P4. This can only be accomplished if inverter I1 is prevented from fighting this high signal being applied to the gate of the PMOS transistor P1. The inverter I1 is prevented from pulling its output low because its negative power supply is routed through the NMOS transistor N5, which is turned off during an under-voltage event.

The circuit shown in FIG. 4 is non-symmetric. It protects components downstream of the analog switch output terminal (Out) from over-voltages and under-voltages applied to the analog switch input terminal (In). However, in some applications it may be desirable to have a symmetric analog switch circuit, which in this context means an analog switch circuit that will shut itself off if an over-voltage or under-voltage is applied to either side of the analog switch circuit (i.e., to either the input terminal (In) or the output terminal (Out)). One way to make such an analog switch circuit is to place two of the switches shown in FIG. 4 in series with the input terminals (In) of both switches brought out as the terminals of the combined switch. A disadvantage of this approach is it places two sets of switching transistors in series, which increases the on resistance (RON). In addition, since the switching transistors P1 and N1 are often much larger than the other transistors in this type of circuit, having two switching transistors in series could potentially take up a great deal of chip area. Therefore, having a symmetric circuit with only one complementary set of switching transistors would typically be preferred. One way to accomplish this is shown in FIG. 5.

Figure 5:
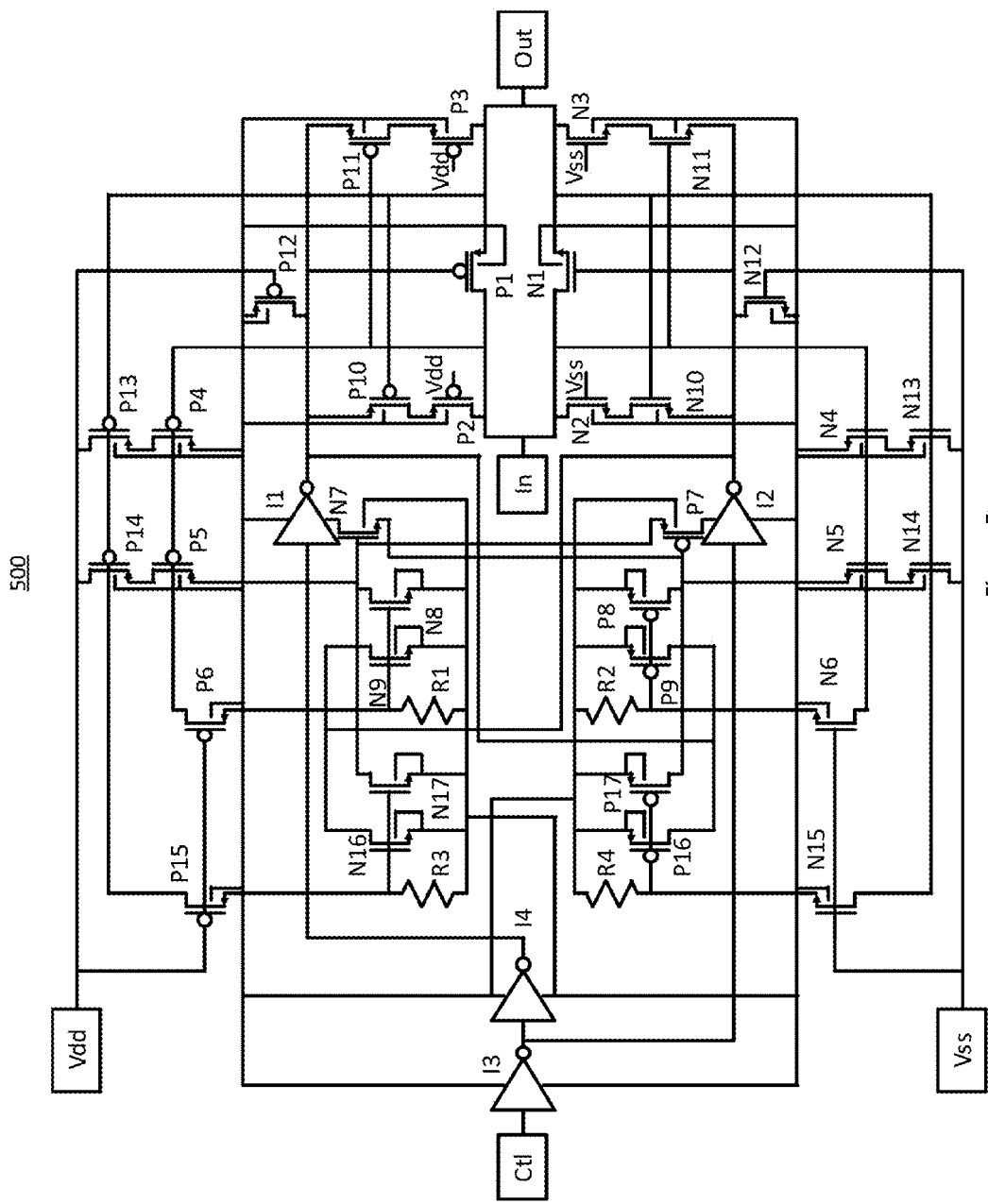
FIG. 5 illustrates an analog switch circuit according to an embodiment of the present invention that builds up the embodiment described with reference to FIG. 4 by adding symmetric over- and under-voltage protection.

An analog switch circuit 500 shown in FIG. 5 has a lot in common with the analog switch circuit 400 shown in FIG. 4. However, several transistors have been added to allow for symmetric protection from both over- and under-voltages. The top half of this circuit is described first. The transistor P1 is the large PMOS switching element. This is the transistor that should be turned off if an over-voltage is applied to either the analog switch input terminal (In) or the analog switch output terminal (Out). First, assume that an over-voltage is applied to the analog switch input terminal (In). This causes the PMOS transistors P2 and P6 to turn on and PMOS transistors P8 and P5 to turn off. The PMOS transistors P4, P5 and P6 work together to place the inverter I1 in pseudo tri-state, which basically works the same as the circuit in FIG. 4. The main difference between FIG. 4 and FIG. 5 is the addition of the cross-coupled arrangement of the PMOS transistors P2, P3, P10, P11, and P12. This arrangement allows the over-voltage applied to the input terminal (In) to pull up the gate of the PMOS switching element transistor P1, turning it off, while preventing a secondary conducting path from being created between the gate of the transistor P1 and the output terminal (Out).

Assume that the analog switch circuit 500 starts out in the on state with PMOS switch P1 conducting. As the voltage on the input terminal (In) rises, the voltage on the output terminal (Out) will initially follow. Once the voltages on both the analog switch input and output terminals (In and Out) exceed the high voltage rail (Vdd) by the threshold voltage, both the PMOS transistors P2 and P3 will turn on. However, the PMOS transistors P10 and P11 will both be turned off, because their gates are being pulled high. When the input voltage raises high enough, the body of the PMOS transistor P1 will be pulled higher than the high voltage rail (Vdd)

through the forward biased drain to body diode of the transistor P1. This body node rising will cause the PMOS transistor P12 to conduct, which will pulls the gate of the transistor P1 to a high voltage causing it to begin to shut down. As the transistor P1 shuts down the analog switch output terminal (Out) will no longer be pulled high by the input over-voltage, so the voltage on the analog switch output terminal (Out) begins to droop. This causes the PMOS transistor P10 to turn on, which allows the over-voltage on the analog switch input terminal (In) to directly drive the gate of the PMOS transistor P1 high through the P2, P10 path. This pulls the gate of the PMOS transistor P1 even higher, turning it off harder. Since the gate of the PMOS transistor P11 is tied to the high voltage on the analog switch input terminal (In), the PMOS transistor P11 is prevented from conducting current from the gate of the transistor P1 to the output terminal (Out). This arrangements works the same if the over-voltage is applied to the analog switch output terminal (Out) instead of the analog switch input terminal (In).

The compliment of this process holds true if the bottom half of this circuit is hit by an under-voltage. The NMOS transistor N2 and N3 would initially turn on. As the body of the NMOS switching transistor N1 is pulled down, the NMOS transistor N12 will turn on and start to pull the gate of the transistor N1 down. As the NMOS transistor N1 begins to shut off, the NMOS transistor N10 turns on and the gate of the NMOS transistor N1 is pulled down even lower through the N2, N10 path, thus shutting the NMOS transistor N1 off even harder. The NMOS transistor N11 does not conduct because its gate is tied to the input terminal (In) receiving the under-voltage.

Advantageously, the analog switch circuits disclosed herein draw a very low quiescent supply current (idd) under all conditions. In the embodiment of FIG. 5, the tri-state inverters 105_1 and 105_2 vary between normal operation, full tri-state, and pseudo tri-state, based on the voltages applied to the analog switch input and output terminals (In and Out). When a tri-state inverter is in a pseudo tri-state, the inverter can only drive the output in one direction (i.e., only up or down) instead of two (i.e., both up and down). Other advantages of specific embodiments of the present invention include the providing of symmetric over- and under-voltage protections, as well as power-off protection.

Under normal operation the above described analog switch circuits act like a standard analog switch circuit. However, during a fault condition (i.e., an over-voltage or an under-voltage condition) the analog switch circuits automatically open to prevent the fault from traveling further downstream (and in certain embodiments from traveling upstream) and possibly causing damage to other sensitive components. The analog switch circuits then return to their normal operating mode once the fault condition ends. Another feature of the above described architectures becomes evident when the circuit is powered down with its positive and negative supplies grounded. Under this condition the analog switch circuit is prevented from conducting. This is often called power off protection, however, with this architecture it's just a specific case of the over- and under-voltage protection.

Figure 6:
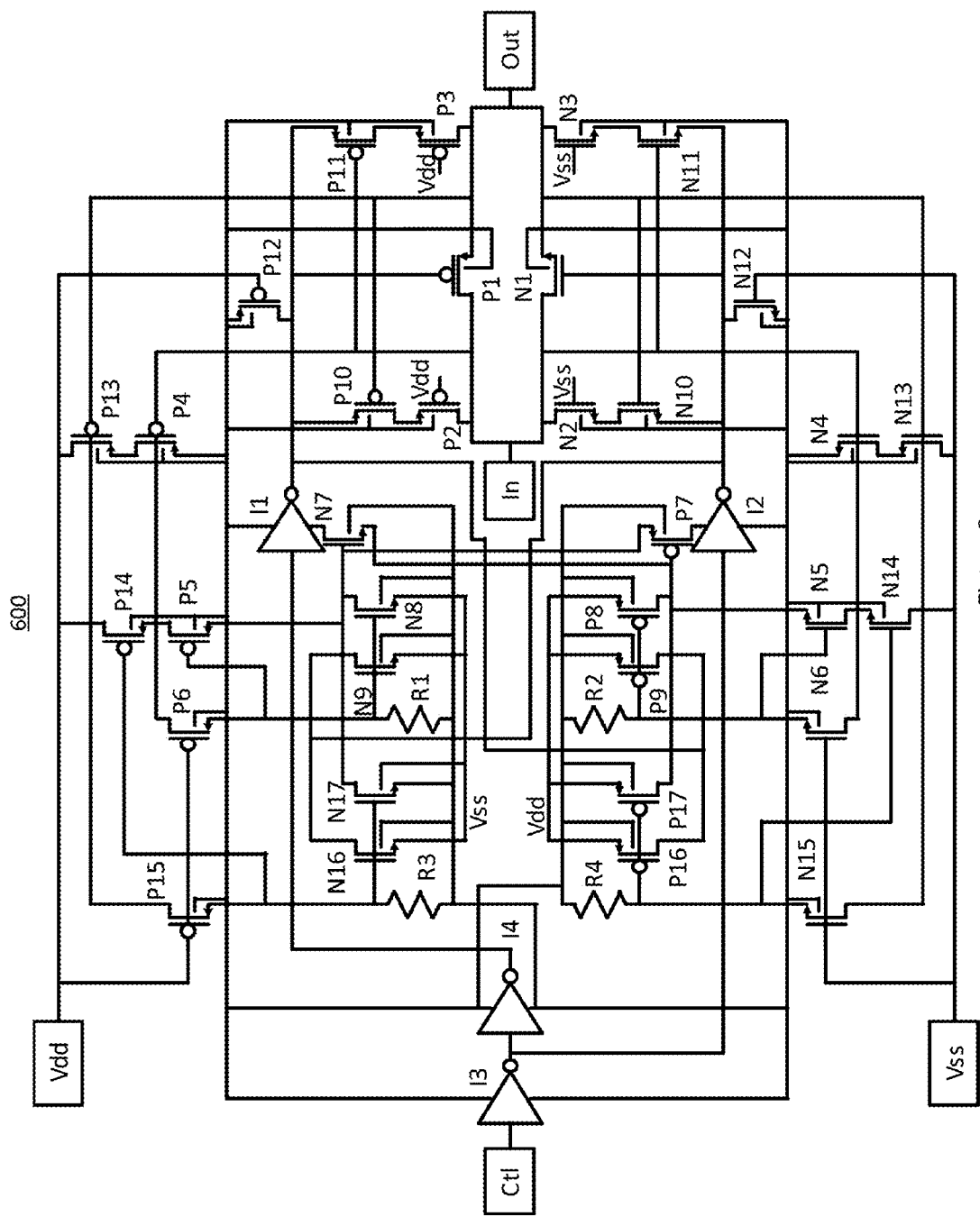
FIG. 6 illustrates an analog switch circuit according to an embodiment of the present invention that builds up the embodiment described with reference to FIG. 5 by providing better rail-to-rail operation.

An analog switch circuit 600 in FIG. 6 is similar to the analog switch circuit in FIG. 5, with a few additional transistors and modifications that enables this circuit to provide for better rail-to-rail operation.

In the above described Figures, the switch controller 104 was shown as including one or two tri-state inverters 105. However, it is also within the scope of an embodiment of the present invention to replace the tri-state inverters with other tri-state logic circuits, such as a tri-state buffer, so long as all the downstream logic functions are appropriately modified.

Figure 7:
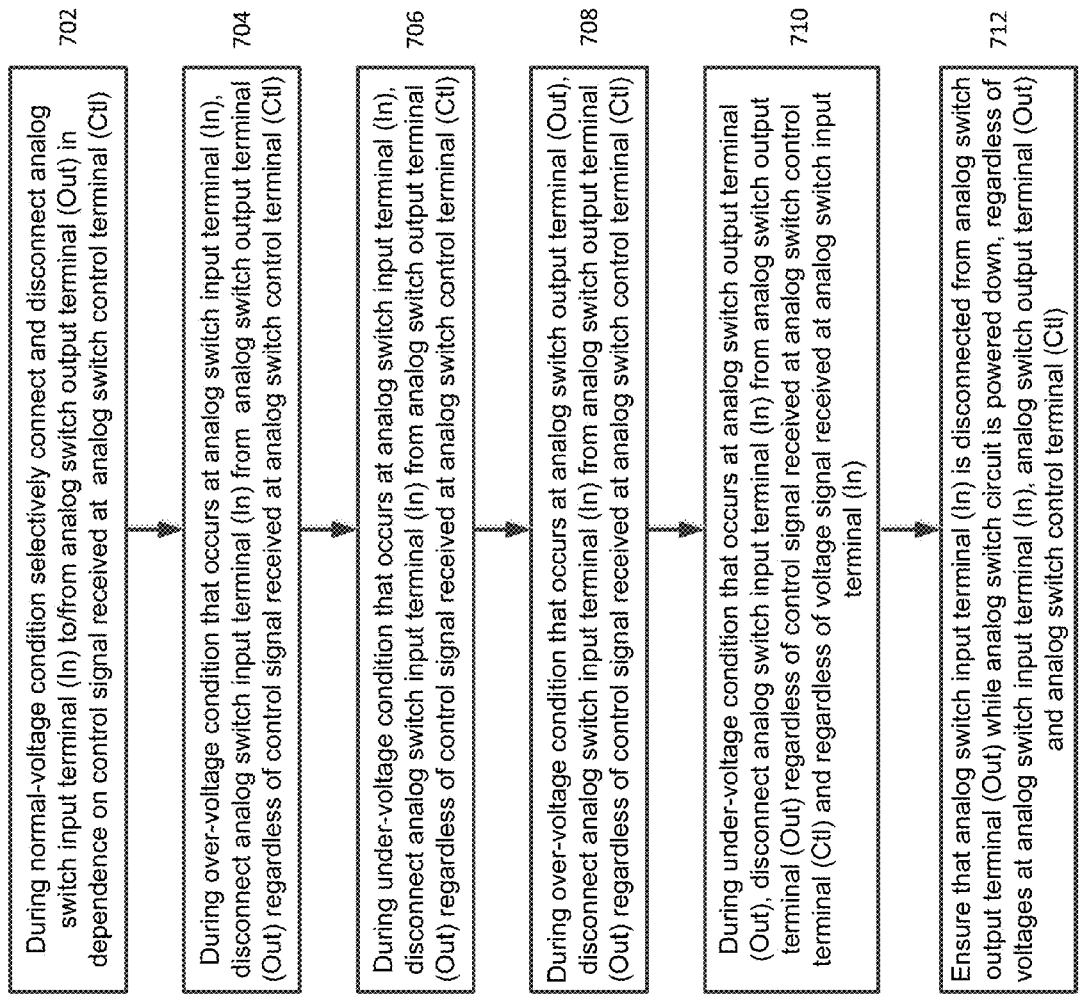
FIG. 7 illustrates a high level flow diagram that is used to summarize methods according to various embodiments of the present invention.

FIG. 7 illustrates a high level flow diagram that is used to summarize methods according to various embodiments of the present invention. The methods described with reference to FIG. 7 are for use with an analog switch circuit that includes an analog switch input terminal (In), an analog switch output terminal (Out), and an analog switch control terminal (Ctl). Referring to FIG. 7, as indicated at step 702, during a normal-voltage condition, the analog switch input terminal (In) is selectively connected and disconnected to/from the analog switch output terminal (Out) in dependence on a control signal received at the analog switch control terminal (Ctl). During an over-voltage condition that occurs at the analog switch input terminal (In), the analog switch input terminal (In) is disconnected from the analog switch output terminal (Out) regardless of the control signal received at the analog switch control terminal (Ctl), as indicated at step 704. During an under-voltage condition that occurs at the analog switch input terminal (In), the analog switch input terminal (In) is disconnected from the analog switch output terminal (Out) regardless of the control signal received at the analog switch control terminal (Ctl), as indicated at step 706.

Steps 708 and 710 provide for symmetric protection. More specifically, as indicated at step 708, during an over-voltage condition that occurs at the analog switch output terminal (Out), the analog switch input terminal (In) is disconnected from the analog switch output terminal (Out) regardless of the control signal received at the analog switch control terminal (Ctl). As indicated at step 710, during an under-voltage condition that occurs at the analog switch output terminal (Out), the analog switch input terminal (In) is disconnected from the analog switch output terminal (Out) regardless of the control signal received at the analog switch control terminal (Ctl). Steps 708 and 710 also occur regardless of a voltage signal received at the analog switch input terminal (In).

Additionally, power off protection is provided. More specifically, as indicated at step 712, the analog switch input terminal (In) is ensured to be disconnected from the analog switch output terminal (Out) while the analog switch circuit is powered down, regardless of the voltages at the analog switch input terminal (In), the analog switch output terminal (Out) and the analog switch control terminal (Ctl).

Additional details of the aforementioned steps are provided in the above description of FIGS. 1-6. Further, it is noted that no specific order is implied by the steps in FIG. 7. In other words, any of the steps described with reference to FIG. 7 can occur before or after any other step, depending upon the voltage signal received at the analog switch input terminal (In), the voltage at the analog switch output terminal (Out), and whether the analog switch circuit is powered up or down.

Figure 8:
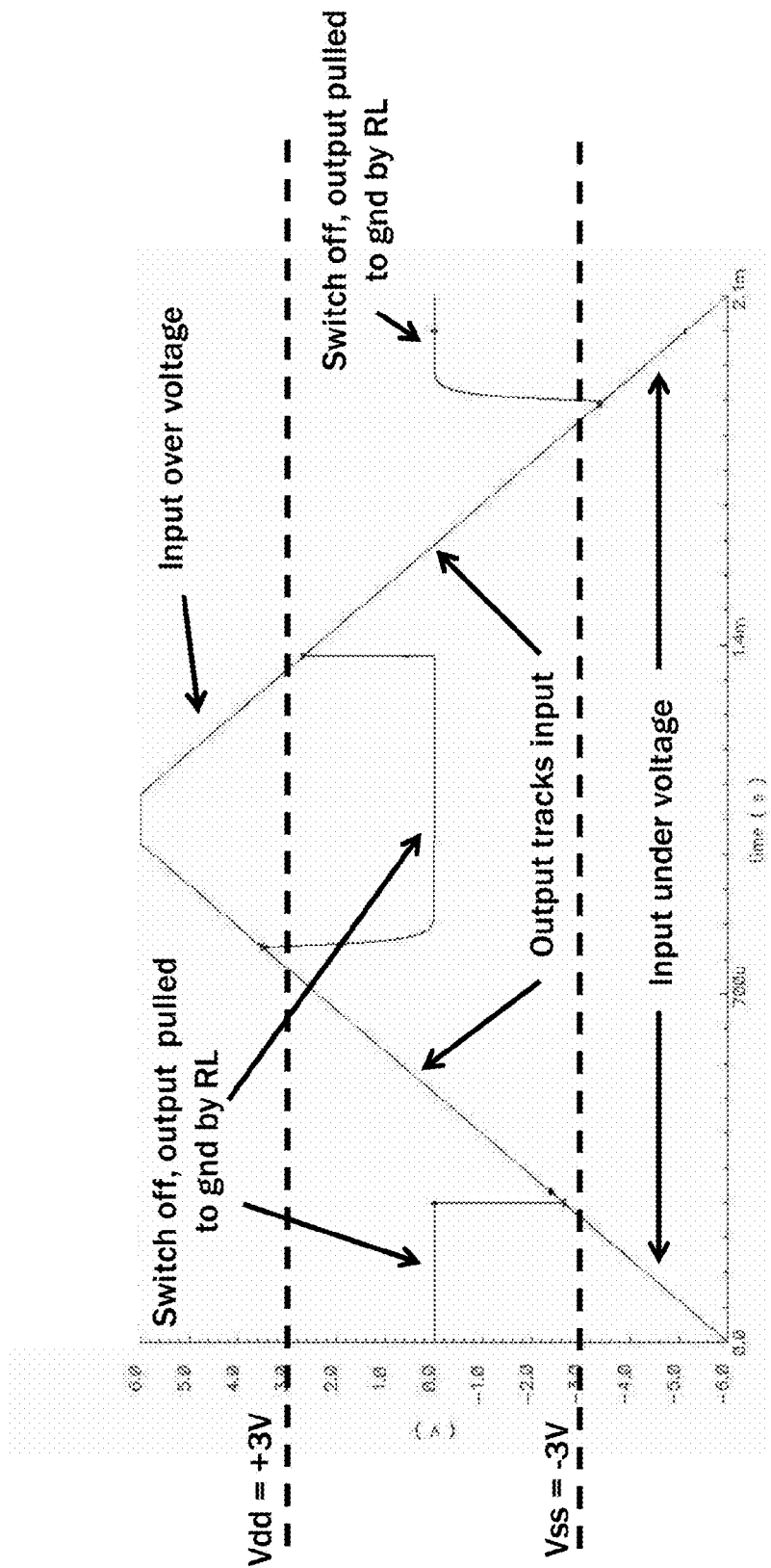
FIG. 8 illustrates a transient simulation of a switch control circuit of an embodiment of the present invention during both over-voltage and under-voltage conditions.

FIG. 8 illustrates a transient simulation of a switch control circuit of an embodiment of the present invention during both over-voltage and under-voltage conditions. For this simulation, it is assumed that a load resistor (e.g., a 10 kΩ load resistor) is connected between the analog switch output terminal (Out) and ground. As can be appreciated from FIG. 8, during over-voltage and under-voltage conditions the analog switch circuit is pulled to ground by the load resistor (e.g., a 10 kΩ load resistor) connected from the analog switch output terminal (Out) to ground, and during a normal operation condition the voltage at the analog switch output terminal (Out) tracks the voltage at the analog switch input terminal (In).

Figure 9:
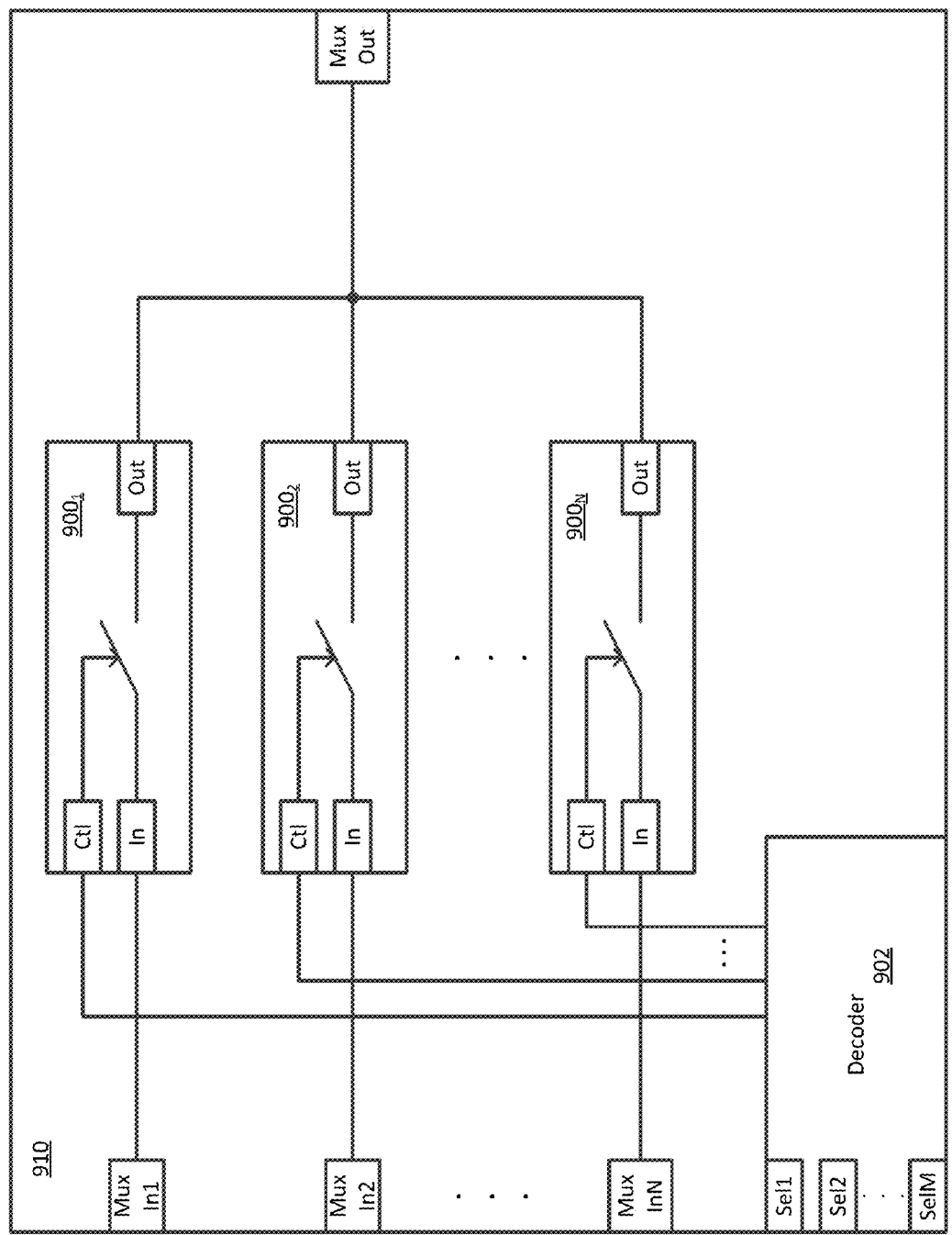
FIG. 9 illustrates an exemplary multiplexer device that includes multiple instances of an analog switch circuit embodiment of the present invention.

FIG. 9 illustrates an exemplary multiplexer 910 that includes multiple instances of an analog switch circuit of an embodiment of the present invention. Referring to FIG. 9, a multiplexer (Mux) 910 is shown as including multiple analog switch circuits $900_1, 900_2 \ldots 900_N$, with can individually or collectively be referred analog switch circuit(s) 900. Each one of the analog switch circuits 900, which can be implemented using one of the embodiments described above with reference to FIGS. 1-6, includes an analog switch input terminal (In), an analog switch output terminal (Out) and an analog switch control terminal (Ctl). Each of the analog switch input terminals (In) is connected to (or provides) a corresponding multiplexer input terminal MuxIn1, MuxIn2 . . . MuxInN. The analog switch output terminals (Out) of the multiple analog switch circuits 900 are tied together and are connected to (or provide) the output terminal (MuxOut) of the multiplexer 910. The multiplexer 910 also includes a decoder 902, which includes select inputs Sel1, Sel2 . . . SelM. Outputs of the decoder 910, which are connected to the control input terminals (Ctl) of the analog switch circuits 900, are used to select which one of the analog switch circuits 900 connects its analog switch input terminal (In) to its analog switch output terminal (Out), while all the other analog switch circuits 900 disconnect their analog switch input terminal (In) from their analog switch output terminal (Out).

The multiplexer 910 can either be powered up or powered down at any given time. In accordance with specific embodiments, while the multiplexer 910 is powered down, voltage rails are grounded, which causes the switching transistor elements (e.g., P1 and N1) within each analog switch circuit 900 to remain turned off until the multiplexer 910, regardless of the voltages at the multiplexer input terminals MuxIn1, MuxIn2 . . . MuxInN, regardless at the voltage at the multiplexer output terminal MuxOut, and regarding of the select/decoder inputs.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that the present invention be limited only by the claims and the equivalents thereof.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. An analog switch circuit, comprising:
an analog switch input terminal (In);
an analog switch output terminal (Out);
an analog switch control terminal (Ctl) that is used to control whether the analog switch input terminal (In) is connected to the analog switch output terminal (Out);
a first transistor of a first polarity (P1) including a first current path terminal (drain) connected to the analog switch input terminal (In), a second current path terminal (source) connected to the analog switch output terminal (Out), and a control terminal (gate); and
a switch controller (104) including a first controller input (103) connected to the analog switch control terminal (Ctl), a first controller output (106) connected to the control terminal (gate) of the first transistor of the first polarity (P1), and an override input (108) connected to the analog switch input terminal (In);
wherein the switch controller (104) also includes a second transistor of the first polarity (P2) including a first current path terminal (drain) connected to the first current path terminal (drain) of the first transistor of the first polarity (P1), a second current path terminal (source) connected to the control terminal (gate) of the first transistor of the first polarity (P1), and a control terminal (gate) connected to a first voltage rail (Vdd).

2. The analog switch circuit of claim 1, wherein:
during a normal-voltage condition,
a voltage at the first controller output is dependent on a control signal received at the analog switch control terminal (Ctl),
the second transistor of the first polarity (P2) is turned off, and
the first transistor of the first polarity (P1) selectively connects and disconnects the analog switch input terminal (In) to/from the analog switch output terminal (Out) in dependence on the first controller output, which is dependent on the control signal received at the analog switch control terminal (Ctl); and
during an over-voltage condition,
the voltage at the first controller output is floating regardless of the control signal received at the analog switch control terminal (Ctl),
the second transistor of the first polarity (P2) is turned on, which pulls the control terminal (gate) of the first transistor of the first polarity (P1) up to the voltage of the voltage signal received at the analog switch input terminal (In), thereby turning off the first transistor of the first polarity (P1) regardless of the control signal received at the analog switch control terminal (Ctl), and
the first transistor of the first polarity (P1), because it is turned off regardless of the control signal received at the analog switch control terminal (Ctl), disconnects the analog switch input terminal (In) from the analog switch output terminal (Out) regardless of the control signal received at the analog switch control terminal (Ctl).

3. The analog switch circuit of claim 2, wherein:
the normal-voltage condition occurs when the voltage signal received at the analog switch input terminal (In) does not exceed the first voltage rail (Vdd) by at least a first threshold voltage; and
the over-voltage condition occurs when the voltage signal received at the analog switch input terminal (In) exceeds the first voltage rail (Vdd) by at least the first threshold voltage.

4. The analog switch circuit of claim 3, wherein each of the transistors of the first polarity also includes a body terminal, and further comprising:
a body controller that provides a first body node (Bn1) to which the body terminal of each of the first and second transistors of the first polarity (P1 and P2) is connected;
wherein the body controller is adapted to
connect the first body node (Bn1) to the first voltage rail (Vdd) during a normal-voltage condition, and
connect the first body node (Bn1) to the analog switch input terminal (In) during an over-voltage condition.

5. The analog switch of claim 1, further comprising:
a first transistor of a second polarity (N1) including a first current path terminal (drain) connected to the analog switch input terminal (In), a second current path terminal (source) connected to the analog switch output terminal (Out), and a control terminal (gate); and wherein the switch controller (104) also includes a second transistor of the second polarity (N2) including a first current path terminal (drain) connected to the first current path terminal (drain) of the first transistor of the second polarity (N1), a second current path terminal (source) connected to the control terminal (gate) of the first transistor of the second polarity (N1), and a control terminal (gate) connected to a second voltage rail (Vss); and wherein the switch controller (104) also includes a second controller output, which is a complement of the first controller output, connected to the control terminal (gate) of the first transistor of the second polarity (N1).

6. The analog switch of claim 5, wherein:
during a normal-voltage condition,
voltages at the first and second controller outputs are dependent on a control signal received at the analog switch control terminal (Ctl),
the second transistor of the first polarity (P2) and the second transistor of the second polarity (N2) are turned off, and
the first transistor of the first polarity (P1) and the first transistor of the second polarity (N1) selectively connect and disconnect the analog switch input terminal (In) to/from the analog switch output terminal (Out) in dependence on voltages at the first and second controller outputs, which are dependent on the control signal received at the analog switch control terminal (Ctl);
during an over-voltage condition,
the voltage at the first controller output is floating regardless of the control signal received at the analog switch control terminal (Ctl),
the second transistor of the first polarity (P2) is turned on, which pulls the control terminal (gate) of the first transistor of the first polarity (P1) up to the voltage of the voltage signal received at the analog switch input terminal (In), thereby turning off the first transistor of the first polarity (P1) regardless of the control signal received at the analog switch control terminal (Ctl),
the control terminal (gate) of the first transistor of the second polarity (N1) is pulled down to the voltage of the second voltage rail (Vss), thereby turning off the first transistor of the second polarity (N1) regardless of the control signal received at the analog switch control terminal (Ctl), and
the first transistor of the first polarity (P1) and the first transistor of the second polarity (N1), because they are turned off regardless of the control signal received at the analog switch control terminal (Ctl), disconnects the analog switch input terminal (In) from the analog switch output terminal (Out) regardless of the control signal received at the analog switch control terminal (Ctl);
during an under-voltage condition,
the voltage at the second controller output is floating regardless of the control signal received at the analog switch control terminal (Ctl),
the second transistor of the second polarity (N2) is turned on, which pulls the control terminal (gate) of the first transistor of the second polarity (N1) down to the voltage of the voltage signal received at the analog switch input terminal (In), thereby turning off the first transistor of the second polarity (N1) regardless of the control signal received at the analog switch control terminal (Ctl),
the control terminal (gate) of the first transistor of the first polarity (P1) is pulled up to the voltage of the first voltage rail (Vdd), thereby turning off the first transistor of the first polarity (P1) regardless of the control signal received at the analog switch control terminal (Ctl), and
the first transistor of the second polarity (N1) and the first transistor of the first polarity (P1), because they are turned off regardless of the control signal received at the analog switch control terminal (Ctl), disconnects the analog switch input terminal (In) from the analog switch output terminal (Out) regardless of the control signal received at the analog switch control terminal (Ctl).

7. The analog switch of claim 6, wherein:
the normal-voltage condition occurs when a voltage signal received at the analog switch input terminal (In) does not cause one of the over-voltage condition and the under-voltage condition;
the over-voltage condition occurs when the voltage signal received at the analog switch input terminal (In) exceeds the first voltage rail (Vdd) by at least a first threshold voltage; and
the under-voltage condition occurs when the voltage signal received at the input terminal (In) of the analog switch circuit is below the second voltage rail (Vss) by at least a second threshold voltage.

8. The analog switch circuit of claim 5, wherein the switch controller includes tri-state logic circuitry, and wherein:
the override input comprises a tri-state input of the tri-state logic circuitry; and
a voltage at the tri-state input, which is dependent on the voltage signal received at the analog switch input terminal (In), controls whether one of the first and second controller outputs is floating.

9. The analog switch circuit of claim 8, wherein the tri-state logic circuitry comprises tri-state inverter circuitry.

10. The analog switch circuit of claim 5, wherein each of the transistors of the first and second polarities also includes a body terminal, and further comprising:
a first body controller that provides a first body node (Bn1) to which the body terminal of each of the first and second transistors of the first polarity (P1 and P2) is connected; and
a second body controller that provides a second body node (Bn1) to which the body terminal of each of the first and second transistors of the second polarity (N1 and N2) is connected;
wherein the first body controller is adapted to
connect the first body node (Bn1) to the first voltage rail (Vdd) during a normal-voltage condition, and
connect the first body node (Bn1) to the analog switch input terminal (In) during an over-voltage condition; and
wherein the second body controller is adapted to
connect the second body node (Bn2) to the second voltage rail (Vss) during a normal-voltage condition, and
connect the second body node (Bn2) to the analog switch input terminal (In) during an under-voltage condition.

11. The analog switch circuit of claim 5, wherein when a voltage at the analog switch output terminal (Out) either exceeds the first voltage rail (Vdd) by a first threshold voltage or is below the second voltage rail (Vss) by a second threshold voltage, the first transistor of the first polarity (P1) and the first transistor of the second polarity (N1) are turned off regardless of the control signal received at the analog switch control terminal (Ctl) and regardless of the voltage signal received at the analog switch input terminal (In), thereby disconnecting the analog switch input terminal (In) from the analog switch output terminal (Out) to thereby protect any circuitry upstream from the analog switch input terminal (In).

12. The analog switch circuit of claim 5, wherein the analog switch circuit can either be powered up or powered down at any given time, and wherein:
while the analog switch circuit is powered down the first and second voltage rails are grounded, which causes the first transistor of the first polarity (P1) and the first transistor of the second polarity (N1) to remain turned off, regardless of the voltages at the analog switch input terminal (In), the analog switch output terminal (Out) and the analog switch control terminal (Ctl), until the analog switch circuit is powered up.

13. A method for use with an analog switch circuit that includes an analog switch input terminal (In), an analog switch output terminal (Out), and an analog switch control terminal (Ctl), the method comprising:
(a) during a normal-voltage condition selectively connecting and disconnecting the analog switch input terminal (In) to/from the analog switch output terminal (Out) in dependence on a control signal received at the analog switch control terminal (Ctl);
(b) during an over-voltage condition that occurs at the analog switch input terminal (In), disconnecting the analog switch input terminal (In) from the analog switch output terminal (Out) regardless of the control signal received at the analog switch control terminal (Ctl); and
(c) during an under-voltage condition that occurs at the analog switch input terminal (In), disconnecting the analog switch input terminal (In) from the analog switch output terminal (Out) regardless of the control signal received at the analog switch control terminal (Ctl).

14. The method of claim 13, further comprising:
(d) during an over-voltage condition that occurs at the analog switch output terminal (Out), disconnecting the analog switch input terminal (In) from the analog switch output terminal (Out) regardless of the control signal received at the analog switch control terminal (Ctl) and regardless of a voltage signal received at the analog switch input terminal (In); and
(e) during an under-voltage condition that occurs at the analog switch output terminal (Out), disconnecting the analog switch input terminal (In) from the analog switch output terminal (Out) regardless of the control signal received at the analog switch control terminal (Ctl) and regardless of the voltage signal received at the analog switch input terminal (In).

15. The method of claim 14, comprising performing steps (a), (b), (c), (d) and (e) using circuitry that draws a quiescent supply current of less than 1 nanoAmp.

16. The method of claim 13, wherein the analog switch circuit is either powered up or powered down at any given time, and further comprising:
(d) ensuring that the analog switch input terminal (In) is disconnected from the analog switch output terminal (Out) while the analog switch circuit is powered down, regardless of the voltages at the analog switch input terminal (In), the analog switch output terminal (Out) and the analog switch control terminal (Ctl).

17. A device, comprising:
a plurality of analog switch circuits, each of which includes an analog switch input terminal (In), an analog switch output terminal (Out), and an analog switch control terminal (Ctl) that is used to control whether the analog switch input terminal (In) is connected to the analog switch output terminal (Out);
a plurality of device input terminals, each of which is connected to the analog switch input terminal (In) of a different one of the analog switch circuits;
a single device output terminal that is connected to the analog switch output terminal (Out) of each of the analog switch circuits; and
a decoder including a plurality of decoder inputs and a plurality of decoder outputs, wherein each of the decoder outputs is connected to the analog switch control terminal (Ctl) of a different one of the analog switch circuits;
wherein each of the analog switch circuits includes
a first transistor of a first polarity (P1) including a first current path terminal (drain) connected to the analog switch input terminal (In), a second current path terminal (source) connected to the analog switch output terminal (Out), and a control terminal (gate); and
a switch controller (104) including a first controller input (103) connected to the analog switch control terminal (Ctl), a first controller output (106) connected to the control terminal (gate) of the first transistor of the first polarity (P1), and an override input (108) connected to the analog switch input terminal (In);
wherein the switch controller (104) also includes a second transistor of the first polarity (P2) including a first current path terminal (drain) connected to the first current path terminal (drain) of the first transistor of the first polarity (P1), a second current path terminal (source) connected to the control terminal (gate) of the first transistor of the first polarity (P1), and a control terminal (gate) connected to a first voltage rail (Vdd).

18. The device of claim 17, wherein each of the analog switch circuits also includes:
a first transistor of a second polarity (N1) including a first current path terminal (drain) connected to the analog switch input terminal (In), a second current path terminal (source) connected to the analog switch output terminal (Out), and a control terminal (gate);
wherein the switch controller (104) also includes a second transistor of the second polarity (N2) including a first current path terminal (drain) connected to the first current path terminal (drain) of the first transistor of the second polarity (N1), a second current path terminal (source) connected to the control terminal (gate) of the first transistor of the second polarity (N1), and a control terminal (gate) connected to a second voltage rail (Vss); and
wherein the switch controller (104) also includes a second controller output, which is a complement of the first controller output, connected to the control terminal (gate) of the first transistor of the second polarity (N1).

19. The device of claim 18, wherein each of the transistors of the first and second polarities of each of the analog switch circuits also includes a body terminal, and wherein each of the analog switch circuits also includes:

a first body controller that provides a first body node (Bn1) to which the body terminal of each of the first and second transistors of the first polarity (P1 and P2) is connected; and a second body controller that provides a second body node (Bn1) to which the body terminal of each of the first and second transistors of the second polarity (N1 and N2) is connected;

wherein the first body controller is adapted to
  connect the first body node (Bn1) to the first voltage rail (Vdd) during a normal-voltage condition, and
  connect the first body node (Bn1) to the analog switch input terminal (In) during an over-voltage condition; and wherein the second body controller is adapted to
  connect the second body node (Bn2) to the second voltage rail (Vss) during a normal-voltage condition, and
  connect the second body node (Bn2) to the analog switch input terminal (In) during an under-voltage condition.

20. The device of claim 18, wherein the device can either be powered up or powered down at any given time, and wherein while the device is powered down the first and second voltage rails are grounded, which causes the first transistor of the first polarity (P1) and the first transistor of the second polarity (N1) of each of the analog switch circuits to remain turned off, regardless of the voltages at the plurality of device input terminals, the single device output terminal, and the decoder inputs.

21. The analog switch circuit of claim 1, wherein:
the override input (108) controls whether the first controller output (106) is dependent on a control signal received at the analog switch control terminal (Ctl), or is floating regardless of the control signal received at the analog switch control terminal (Ctl).

22. The analog switch circuit of claim 5, wherein:
the override input (108) controls whether each of the first and second controller outputs is dependent on a control signal received at the analog switch control terminal (Ctl), or at least one of the first and second controller outputs is floating regardless of the control signal received at the analog switch control terminal (Ctl).

* * * * *